(12) United States Patent
Miyashita et al.

(10) Patent No.: US 6,784,720 B2
(45) Date of Patent: Aug. 31, 2004

(54) CURRENT SWITCHING CIRCUIT

(75) Inventors: Miyo Miyashita, Tokyo (JP); Kazuya Yamamoto, Tokyo (JP); Masaaki Shimada, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/310,183

(22) Filed: Dec. 5, 2002

(65) Prior Publication Data
US 2003/0227319 A1 Dec. 11, 2003

(30) Foreign Application Priority Data
Jun. 6, 2002 (JP) .......................................... 2002-165607

(51) Int. Cl.$^7$ ............................................ H03K 17/687
(52) U.S. Cl. ........................ 327/427; 327/108; 327/404; 327/322; 327/328
(58) Field of Search ................................... 327/108, 109, 327/111, 112, 318, 320, 322, 328, 391, 427, 498.4, 403, 404, 405, 542, 543, 540, 415–417, 437, 477, 484; 326/83, 115; 323/315

(56) References Cited

U.S. PATENT DOCUMENTS

| 4,791,326 | A | * | 12/1988 | Vajdic et al. | ................ | 327/391 |
| 5,225,717 | A | | 7/1993 | Shiomi et al. | ................ | 326/66 |
| 6,078,206 | A | * | 6/2000 | Watarai | ..................... | 327/320 |

FOREIGN PATENT DOCUMENTS

| JP | 60-208105 | 10/1985 |
| JP | 6-196995 | 7/1994 |
| JP | 2000-101428 | 4/2000 |

* cited by examiner

Primary Examiner—Long Nguyen
(74) Attorney, Agent, or Firm—Leydig, Voit & Mayer, Ltd.

(57) ABSTRACT

In a current switching circuit, a complementary circuit switches, in response to an input signal, a pair of current mirror circuits between a first state, enabling the first of the current mirror circuits, through a first current mirror current and disabling the second of the current mirror circuits, and a second state, disabling the first of the current mirror circuits and enabling the second of the current mirror circuits, through a second current, mirror current such that at least one of the first and second current mirror currents flows through a level shift circuit as a level shift current.

9 Claims, 10 Drawing Sheets

CURRENT SWITCHING CIRCUIT

BACKGROUND OF THE INVENTION

1. Field of the Invention

The present invention generally relates to current switching circuits employing an inverter constituted by a p-channel MOS transistor and an n-channel MOS transistor in a Si-CMOS integrated circuit (IC) or a pnp bipolar transistor and an npn bipolar transistor in a Si-bipolar junction transistor (BJT IC), for example, a current switching circuit for switching output data, which is used for a current mode logic (CML) mode selector circuit and, more particularly, to a current switching circuit in which even if a supply voltage larger than a breakdown voltage of constituent transistors is used, it is guaranteed that voltages applied to the transistors do not exceed the breakdown voltage.

2. Description of the Prior Art

On account of remarkable progress of miniaturization of Si-CMOS processing and Si-BJT processing in recent years, Si-CMOS and Si-BJT ICs have high-speed response characteristics equivalent to or better than those of GaAs devices. Thus, the Si-CMOS and the Si-BJT ICs have rapidly expanded their fields of application to optical communication ICs and radio communication ICs, operating at frequencies exceeding several GHz and act as key devices for lowering production cost of each system.

High-speed performance obtained by miniaturization of transistors brings about drop of a device breakdown voltage. It has so far been a general practice that in order to secure reliability of a circuit, a regulator or the like reduces a supply voltage of the circuit lower than a device breakdown voltage from a supply voltage specified for each system. However, in case an output amplitude approximate to the breakdown voltage is necessary in a circuit in which a switching transistor and a current source transistor are vertically stacked on each other as in a differential circuit, the supply voltage of the circuit should be set higher than the device breakdown voltage. If the differential circuit and a current switching circuit are used in combination under these circumstances, a problem arises that a voltage not less than the breakdown voltage is surely applied to one of a p-channel MOS transistor or a pnp bipolar transistor and an n-channel MOS transistor or an npn bipolar transistor, thereby resulting in device breakdown.

FIG. 17 shows one example of a configuration of a conventional current switching circuit employing a CMOS IC. The conventional current switching circuit of FIG. 17 includes a positive power source 1 having a positive voltage Vdd, a negative power source 2 having a negative voltage Vss, a signal input terminal IN, signal output terminals OUT1 and OUT2, n-channel MOS transistors Q1, Q2 and Q10 for supplying an output current to the signal output terminal OUT1 and a resistance element 11 having a resistance R1. The resistance element 11 determines a drain current flowing through the n-channel MOS transistor Q2. The conventional current switching circuit further includes a p-channel MOS transistor Q3, an n-channel MOS transistor Q4, n-channel MOS transistors Q5 and Q13 for supplying an output current to the signal output terminal OUT2 and a resistance element 12 having a resistance R2. A CMOS inverter 20 is constituted by the p-channel MOS transistor Q3 and the n-channel MOS transistor Q4. The resistance element 12 determines a drain current flowing through the n-channel MOS transistor Q5.

In the conventional current switching circuit of FIG. 17, it is supposed, for example, that the positive power source 1 is grounded and the negative voltage Vss supplied to the negative power source 2 satisfies a relation of ($|Vss|>2\times Vth$) where Vth is, for example, a positive threshold voltage of the transistors Q1 to Q5. Initially, a case is considered in which the signal input terminal IN is at high level upon reception of, for example, the positive voltage Vdd. In this case, since a gate-source voltage Vgs1 of the transistor Q1 and a gate-source voltage Vgs2 of the transistor Q2 become larger than the threshold voltage Vth, the transistors Q1 and Q2 are turned on and thus, a drain current Id2 flows through both of the transistors Q1 and Q2. The drain current Id2 is determined by the resistance R1 of the resistance element 11 and a voltage across opposite ends of the resistance element 11.

Since a gate voltage Vg2 ($\neq$Vss) generated in the transistor Q2 in response to the drain current Id2 is applied to a gate terminal of the transistor Q10, a drain current Id10 flows through the transistor Q10 in response to a gate-source voltage of the transistor Q10. If a drain voltage of the transistor Q11 is biased in a saturation area, the drain current Id10 is substantially determined by a ratio of a gate width Wq2 of the transistor Q2 to a gate width Wq10 of the transistor Q10, i.e., (Wq2/Wq10) and a relation of {Id10=Id2×(Wq10/Wq2)} is obtained. The drain current Id10 flows to the signal output terminal OUT1.

The signal input terminal IN is also connected to gate terminals of the p-channel MOS transistor Q3 and the n-channel MOS transistor Q4. Since the signal input terminal IN has the positive voltage Vdd, a gate-source voltage Vgs3 of the p-channel MOS transistor Q3 is smaller than the threshold voltage Vth, so that the p-channel MOS transistor Q3 is turned off. On the other hand, since a gate-source voltage Vgs4 of the n-channel MOS transistor Q4 becomes larger than the threshold voltage Vth, the n-channel MOS transistor Q4 is turned on and a drain voltage of the n-channel MOS transistor Q4 drops to the negative voltage Vss.

Thus, since an output from the CMOS inverter 20, namely, a junction of a drain terminal of the p-channel MOS transistor Q3 and a drain terminal of the n-channel MOS transistor Q4 has the negative voltage Vss, electric current does not flow through the resistance element 12 and the transistor Q5, so that a gate voltage Vg5 of the transistor Q5 also has the negative voltage Vss. Since this gate voltage Vg5 (=Vss) of the transistor Q5 is applied to a gate terminal of the transistor Q13, a gate-source voltage Vgs13 of the transistor Q13 becomes smaller than the threshold voltage Vth and thus, a drain current does not flow through the transistor Q13. Therefore, there is no electric current flowing to a drain terminal of the transistor Q13 from the signal output terminal OUT2.

Then, a case is considered in which the signal input terminal IN is at law level upon reception of, for example, the negative voltage Vss. In this case, since electric current does not flow through the transistors Q1 and Q2 and the resistance element 11, there is no electric current flowing from the signal output terminal OUT1. Since the signal input terminal IN has the negative voltage Vss, the gate-source voltage Vgs3 of the p-channel MOS transistor Q3 becomes larger than the threshold voltage Vth and thus, the channel MOS transistor Q3 is turned on. On the other hand, since the gate-source voltage Vgs4 of the n-channel MOS transistor Q4 becomes smaller than the threshold voltage Vth, the n-channel MOS transistor Q4 is turned off and the drain voltage of the n-channel MOS transistor Q4 rises to the positive voltage Vdd. Therefore, an output from the CMOS inverter 20 has the positive voltage Vdd.

Hence, a voltage is applied across opposite ends of the resistance element 12 and thus, a drain current Id5 flows through the transistor Q5. The drain current Id5 is determined by the resistance R2 of the resistance element 12 and a voltage across opposite ends of the resistance element 12. Since the gate voltage Vg5 generated in the transistor Q5 in response to the drain current Id5 is applied to the gate terminal of the transistor Q13, a drain current Id13 generated in response to the gate-source voltage Vgs13 (=Vg5−Vss) of the transistor Q13 flows from the signal output terminal OUT2.

Even if the signal output terminal is switched to either one of OUT1 and OUT2 in response to an input signal by setting the resistance R1 of the resistance element 11 and the resistance R2 of the resistance element 12 such that a relation of (Id2=Id5) is satisfied, a substantially identical quantity of electric current flows into a selected one of the signal output terminals OUT1 and OUT2. Therefore, since the current switching circuit is capable of switching for causing an electric current to flow through either one of the transistors Q2 and Q5 by setting an input voltage at high level or low level, the signal output terminal for outputting electric current can be switched to either of OUT1 and OUT2.

FIG. 18 shows one example of a selector circuit to which the conventional current switching circuit of FIG. 17 is applied. In FIG. 18, a rectangular portion enclosed by broken lines represents the conventional current switching circuit of FIG. 17. The known selector circuit of FIG. 18 includes n-channel MOS transistors Q8 and Q9 which have source terminals connected to each other so as to form a differential pair. A drain terminal of the n-channel MOS transistor Q10 is connected to a junction of the source terminals of the differential pair of the n-channel MOS transistors Q8 and Q9 such that the n-channel MOS transistor Q10 acts as a current source transistor for determining, in accordance with a voltage inputted to the gate terminal of the n-channel MOS transistor Q10, electric current flowing through the differential pair. The gate voltage of the n-channel MOS transistor Q10 is supplied from a gate terminal of the n-channel MOS transistor Q2.

The known selector circuit further includes n-channel MOS transistors Q11 and Q12 which have source terminals connected to each other so as to form a differential pair. A drain terminal of the n-channel MOS transistor Q13 is connected to a junction of the source terminals of the differential pair of the n-channel MOS transistors Q11 and Q12 such that the n-channel MOS transistor Q13 acts as a current source transistor for determining, in accordance with a voltage inputted to the gate terminal of the n-channel MOS transistor Q13, electric current flowing through the differential pair. The gate voltage of the n-channel MOS transistor Q13 is supplied from a gate terminal of the n-channel MOS transistor Q5. The known selector circuit further includes a resistance element 18 having a load resistance R8 and a resistance element 19 having a load resistance R9. The resistance element 18 is connected between drain terminals of the transistors Q8 and Q11 and the positive power source 1, while the resistance element 19 is connected between drain terminals of the transistors Q9 and Q12 and the positive power source 1.

Meanwhile, the known selector circuit further includes a data input terminal DA1 for the selector circuit, a data input terminal DA2 complementary to the data input terminal DA1, a further data input terminal DA3, a data input terminal DA4 complementary to the data input terminal DA3, a signal output terminal O1 for the selector circuit and a signal output terminal O2 complementary to the signal output terminal O1.

In case the signal input terminal IN is at high level upon reception of, for example, the positive voltage Vdd, the gate voltage Vg2 (≠Vss) of the transistor Q2 is applied to the gate terminal of the transistor Q10 and thus, the drain current Id10 flows through the transistor Q10 in response to the gate-source voltage of the transistor Q10. If the drain voltage of the transistor Q10 is biased in the saturation area, the drain current Id10 is substantially determined by the ratio of the gate width Wq2 of the transistor Q2 to the gate width Wq10 of the transistor Q10, i.e., (Wq2/Wq10) and a relation of {Id10=Id2×(Wq10/Wq2)} is obtained. The drain current Id10 is switched to either one of the transistors Q8 and Q9 in response to complementary signal voltages inputted to the data input terminals DA1 and DA2, respectively and flows through the resistance element 18 or 19 connected to the drain terminal of the transistor Q8 or Q9. As a result, a voltage signal having a voltage equal to (R8×Id10) or (R9×Id10) is outputted to the signal output terminal O1 or O2.

On the other hand, since the gate voltage Vg5 (=Vss) of the transistor Q5 is applied to the gate terminal of the transistor Q13, a gate-source voltage Vg13 of the transistor Q13 becomes smaller than the threshold voltage Vth, so that no drain current flows through the transistor Q13. Therefore, even if any signal is inputted to each of the data input terminals DA3 and DA4, no electric current flows through the resistance elements 18 and 19 via the transistors Q11 and Q12, so that the signals inputted to the data input terminals DA3 and DA4 do not exert any influence on signals fetched from the signal output terminals O1 and O2.

On the contrary, in case the signal input terminal IN is at low level upon reception of, for example, the negative voltage Vss, the gate voltage of the transistor Q10 assumes Vss and a gate voltage of the transistor Q13 assumes Vg3 (≠Vss), so that electric current flows through the transistor Q13 and thus, the signals fetched from the signal output terminals O1 and O2 depend on only the signals inputted to the data input terminals DA3 and DA4 and are not affected at all by signals inputted to the data input terminals DA1 and DA2. Thus, by setting the input voltage of the current switching circuit at high level or low level in the known selector circuit of FIG. 18, it is possible to switch electric current to flow through either one of the transistors Q10 and Q13, so that it is possible to select whether the input signals of the data input terminals DA1 and DA2 are used or the input signals of the data input terminals DA3 and DA4 are used.

In view of reliability of the known selector circuit of FIG. 18, it has been a general practice to set a supply voltage (=Vdd−Vss) at not more than a device breakdown voltage. It is assumed here that a drain-source breakdown voltage BVds, a gate-drain breakdown voltage BVgd and a gate-source breakdown voltage BVgs are substantially equal to one another. For example, in the case of a MOS transistor having a gate length of 2.5 μm, the device breakdown voltage is 2.5 V and thus, the supply voltage is set at not more than 2.5 V. Meanwhile, in the case of a MOS transistor having a gate length of 1.8 μm, the device breakdown voltage is 1.8 V and thus, the supply voltage is set at not more than 1.8 V.

In order to improve high-speed response characteristics of circuits, progress in high-speed response of devices has so far been made by miniaturization at the sacrifice of the device breakdown voltage. On the other hand, a predetermined level is required of output amplitudes of the circuits irrespective of the device breakdown voltage. In order to meet the recent demand for higher-speed response of the devices, the device breakdown voltage is required to be lowered to a level equivalent to that of the output amplitudes.

If an output amplitude which is so large as to be equivalent to the device breakdown voltage is obtained from the signal output terminals Q1 and Q2 in the known selector circuit of FIG. 18, a bias voltage approximate to the device breakdown voltage should be applied between a drain and a source of each of the transistors Q8, Q9, Q11 and Q12. In this case, the supply voltage (=Vdd−Vss) should be set at a sum of the device breakdown voltage and a drain-source voltage of the transistors Q10 and Q13, which drain-source voltage is a voltage required for operation in a saturation area.

At this time, the breakdown voltage of the p-channel MOS transistor Q3 and the n-channel MOS transistor Q4 in the CMOS inverter 20 of the current switching circuit poses a problem. In case the signal input terminal IN is at high level upon reception of, for example, the positive voltage Vdd, a drain voltage of the transistors Q3 and Q4 assumes Vss, so that a bias not less than the device breakdown voltage is applied between a drain terminal and a source terminal and between a gate terminal and the drain terminal of the transistor Q3 as well as between a gate terminal and a source terminal and between the gate terminal and a drain terminal of the transistor Q4, thereby resulting in such an inconvenience as device breakdown.

In case the signal input terminal IN is at low level upon reception of, for example, the negative voltage Vss, the drain voltage of the transistors Q3 and Q4 assumes Vdd, so that a bias not less than the device breakdown voltage is applied between the gate terminal and the source terminal and between the gate terminal and the drain terminal of the transistor Q3 as well as between the drain terminal and the source terminal and between the gate terminal and the drain terminal of the transistor Q4, thus resulting in also such a disadvantage as device breakdown.

SUMMARY OF THE INVENTION

Accordingly, an essential object of the present invention is to provide, with a view to eliminating the above mentioned drawbacks of prior art, a current switching circuit in which even if a supply voltage larger than a breakdown voltage of respective devices is used, it is guaranteed that voltages applied to the devices do not exceed the breakdown voltage.

In order to accomplish this object of the present invention, a current switching circuit according to the present invention includes a complementary circuit which is connected between a first power source and a second power source having a potential lower than that of the first power source. One of a pair of current mirror circuits is connected to the complementary circuit. A level shift element is connected between one of the first and second power sources and the complementary circuit and imparts a predetermined voltage drop to the complementary circuit by a level shift current flowing through the level shift element. In response to an input signal of a first level, the complementary circuit switches one of the current mirror circuits to a first state in which that current mirror circuit is enabled, by supplying a first current mirror current thereto and the other of the current mirror circuits is disabled, and in response to an input signal of a second level switches the one of the current mirror circuits to a second state in which the one of the current mirror circuits is disabled and the other of the current mirror circuits is enabled and a second current mirror current is supplied thereto. At least one of the first and second current mirror currents flows through the level shift circuit as a level shift current.

BRIEF DESCRIPTION OF THE DRAWINGS

This object and features of the present invention will become apparent from the following description taken in conjunction with the preferred embodiments thereof with reference to the accompanying drawings in which.

Before the description of the present invention proceeds, it is to be noted that like parts are designated by like reference numerals throughout several views of the accompanying drawings.

DETAILED DESCRIPTION OF THE INVENTION

Hereinafter, embodiments of the present invention are described with reference to the drawings.

First Embodiment

Figure 1:
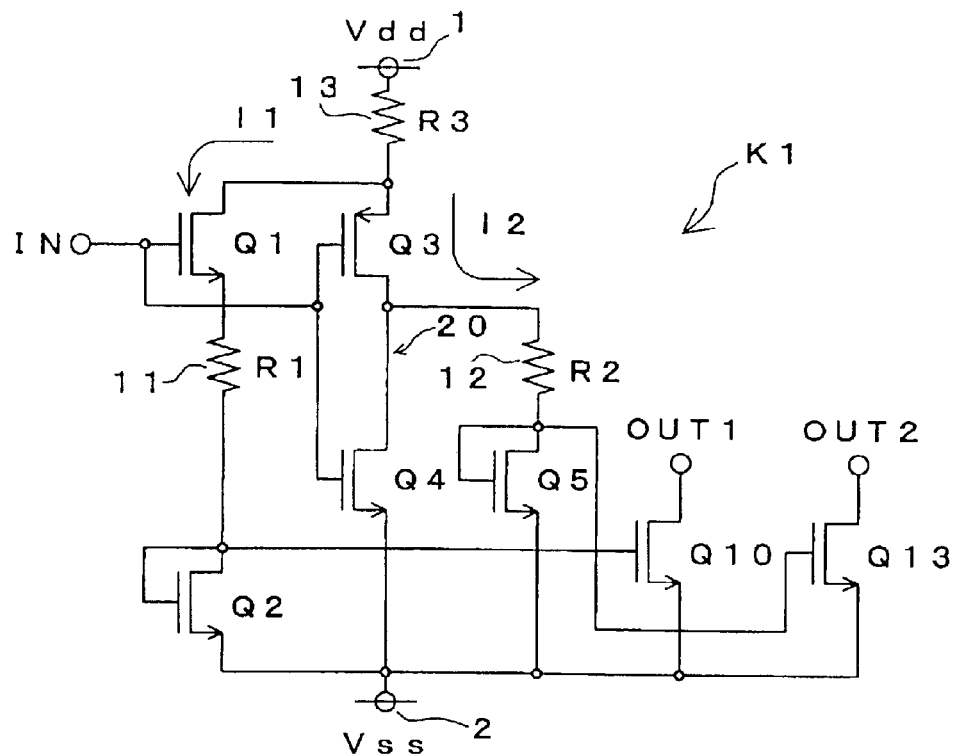
FIG. 1 is a circuit diagram of a current switching circuit according to a first embodiment of the present invention.
Figure 17:
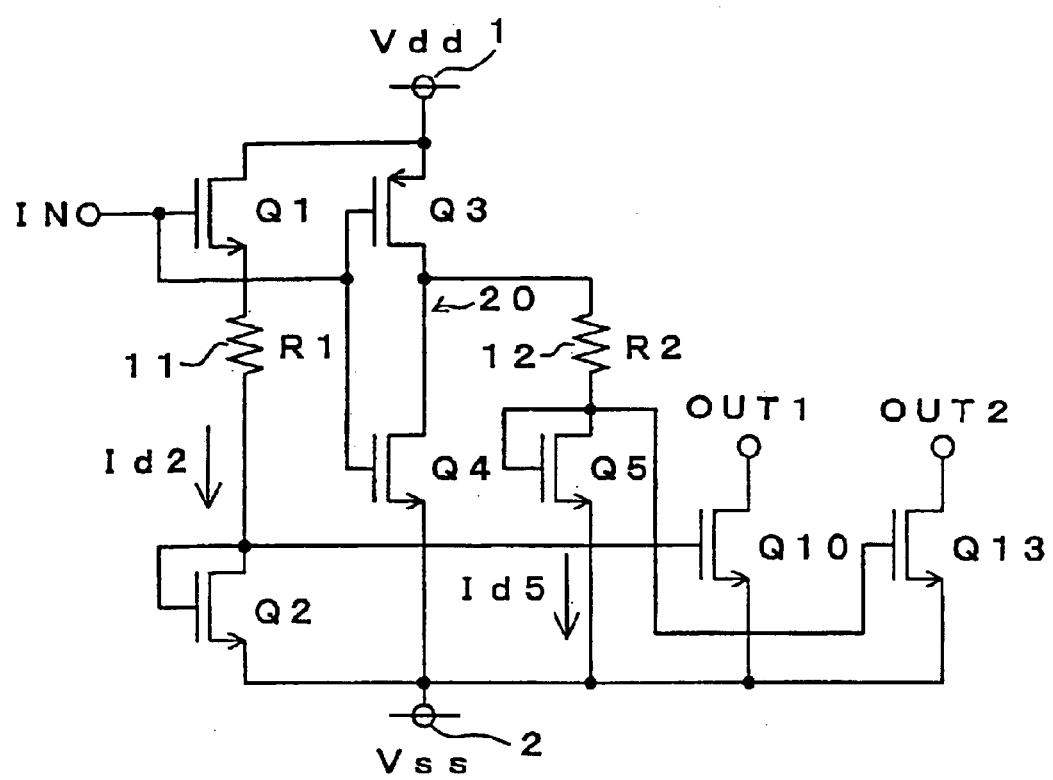
FIG. 17 is a circuit diagram of a prior art current switching circuit.
Figure 18:
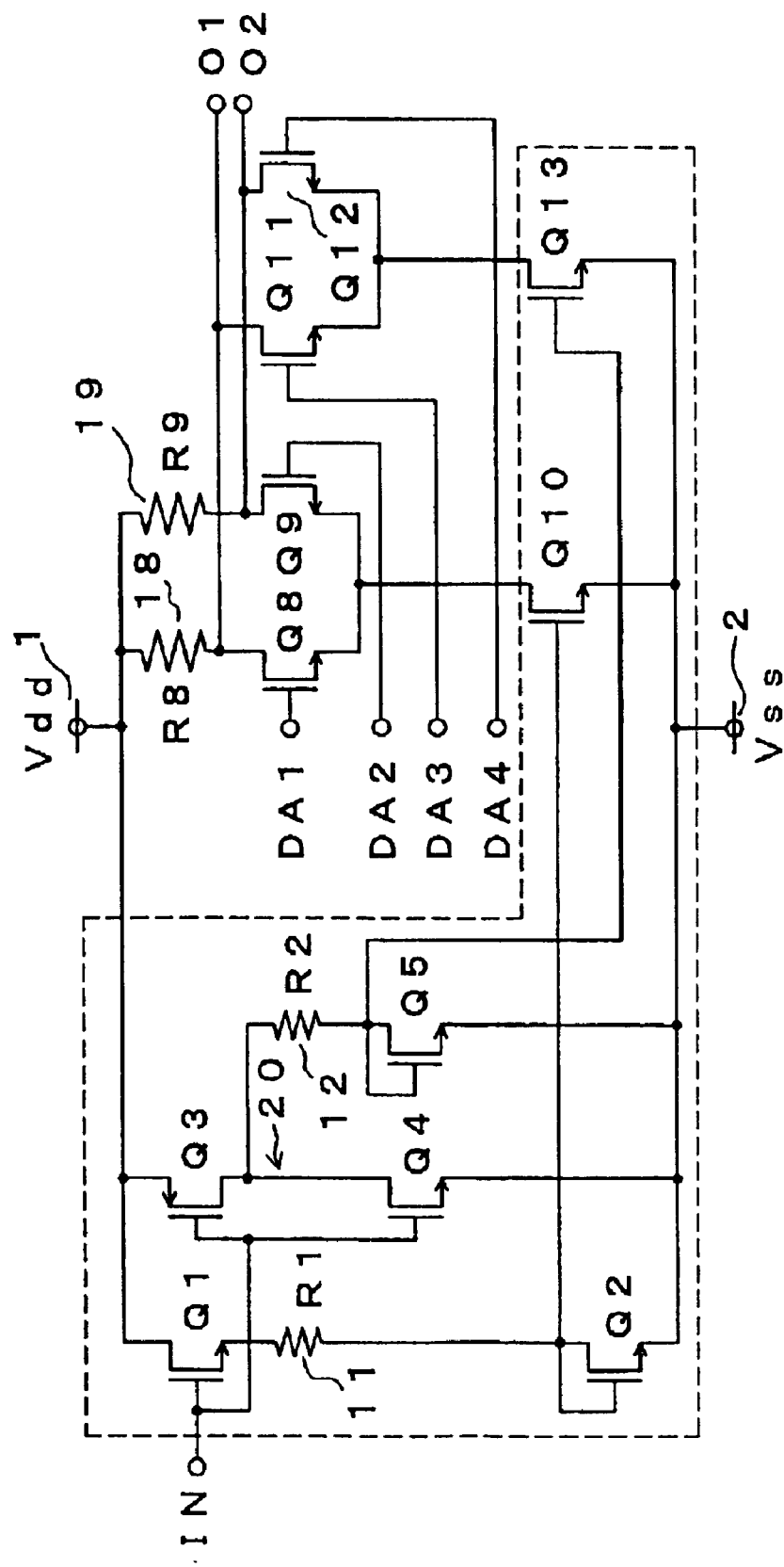
FIG. 18 is a circuit diagram of a prior art selector circuit employing the prior art current switching circuit of FIG. 17.

FIG. 1 shows a current switching circuit K1 according to a first embodiment of the present invention. In the same manner as a conventional current switching circuit of FIG. 17, this current switching circuit K1 includes a positive power source 1 having a positive voltage Vdd, a negative power source 2 having a negative voltage Vss, a signal input terminal IN, signal output terminals OUT1 and OUT2, n-channel MOS transistors Q1, Q2 and Q10 for supplying an output current to the signal output terminal OUT1, a resistance element 11 having a resistance R1, a p-channel MOS transistor Q3, an n-channel MOS transistor Q4, n-channel MOS transistors Q5 and Q13 for supplying an output current to the signal output terminal OUT2 and a resistance element 12 having a resistance R2. The resistance element 11 determines a first electric current (drain current) I1 flowing through the n-channel MOS transistor Q2, while the resistance element 12 determines a second electric current (drain current) I2 flowing through the n-channel MOS transistor Q5. A CMOS inverter 20 is constituted by the p-channel MOS transistor Q3 and the n-channel MOS transistor Q4.

The current switching circuit K1 further includes a resistance element 13 having a resistance R3. The resistance element 13 is connected between the positive power source 1 and the p-channel MOS transistor Q3. The resistance element 13 acts as a level shift element for imparting a predetermined voltage drop to the CMOS inverter 20 such that a voltage applied to the CMOS inverter 20 is not more than a breakdown voltage.

This current switching circuit K1 includes a pair of current mirror circuits, i.e., a first current mirror circuit having the resistance element 11 and the n-channel MOS transistors Q2 and Q10 and a second current mirror circuit having the resistance element 12 and the n-channel MOS transistors Q5 and Q13. In response to an input signal applied to the signal input terminal IN, the CMOS inverter 20 acting as a complementary circuit switches the current mirror circuits to a first state in which the first current mirror circuit is enabled by supplying the first electric current I1 thereto and the second current mirror circuit is disabled by blocking current thereto and a second state in which the first current mirror circuit is disabled by blocking current thereto and the second current mirror circuit is enabled by supplying the second electric current I2 thereto. The first electric current I1 flowing through the first current mirror circuit flows through the resistance element 13 as a first level shift current, while the second electric current I2 flowing through the second current mirror circuit flows through the resistance element 13 as a second level shift current.

In the current switching circuit K1, it is supposed, for example, that the positive power source 1 is grounded and the negative voltage Vss supplied to the negative power source 2 satisfies a relation of (|Vss|>2×Vth) where Vth is, for example, a positive threshold voltage of the transistors Q1 to Q5. In case the signal input terminal IN is at high level upon reception of, for example, the positive voltage Vdd, the current mirror circuits are set to the above mentioned first state, so that a gate-source voltage Vgs1 of the transistor Q1 and a gate-source voltage Vgs2 of the transistor Q2 become larger than the threshold voltage Vth of the transistors Q1 to Q5 and thus, the transistors Q1 and Q2 are turned on. As a result, the first electric current I1 flows through the transistors Q1 and Q2.

Since the first electric current I1 flows through the transistors Q1 and Q2 by way of the resistance element 13, a voltage drop at a drain voltage of the transistor Q1 from the positive voltage Vdd is equal to a product of the first electric current I1 and the resistance R3. On the other hand, since an output voltage of the CMOS inverter 20 is the negative voltage Vss, the transistor Q5 is turned off, so that the second electric current I2 does not flow through the transistor Q5.

On the contrary, in case the signal input terminal IN is at low level upon reception of, for example, the negative voltage Vss, the current mirror circuits are set to the above mentioned second state, so that the transistor Q2 is turned off and thus, the first electric current I1 does not flow through the transistor Q2. On the other hand, since the output voltage of the CMOS inverter 20 rises to the positive voltage Vdd, the transistor Q5 is turned on, so that the second electric current I2 flows through the transistor Q5. If the resistances R1 and R2 are set such that the first electric current I1 and the second electric current I2 are equal to each other, a level shift amount at the resistance element 13 is kept constant regardless of the input signal applied to the signal input terminal IN.

Meanwhile, if the resistance R3 is selected such that not only a difference obtained by subtracting the level shift amount at the resistance element 13, i.e., a product of the first electric current I1 and the resistance R3, or a product of the second electric current I2 and the resistance R3 from a supply voltage (Vdd−Vss) is not more than a device breakdown voltage, i.e., a drain-source breakdown voltage BVds of the transistors Q3 and Q4, and a gate-drain breakdown voltage BVgd of the transistor Q1, but the product of the first electric current I1 and the resistance R3 or the product of the second electric current I2 and the resistance R3 is not more than the device breakdown voltage, i.e., a gate-drain breakdown voltage BVgd of the transistors Q1, Q3 and Q4, the transistors Q1, Q3 and Q4 operate at all times in a bias state not more than the device breakdown voltage. As a result, without breakdown of the transistors Q1, Q3 and Q4, the transistors Q1, Q3 and Q4 can be used up to a large supply voltage which is twice the device breakdown voltage at a maximum.

In this embodiment, even if the supply voltage not less than the breakdown voltage of the transistors Q1, Q3 and Q4 is used, it is guaranteed that the transistors Q1, Q3 and Q4 operate at all times in the bias state not more than the breakdown voltage.

Second Embodiment

Figure 2:
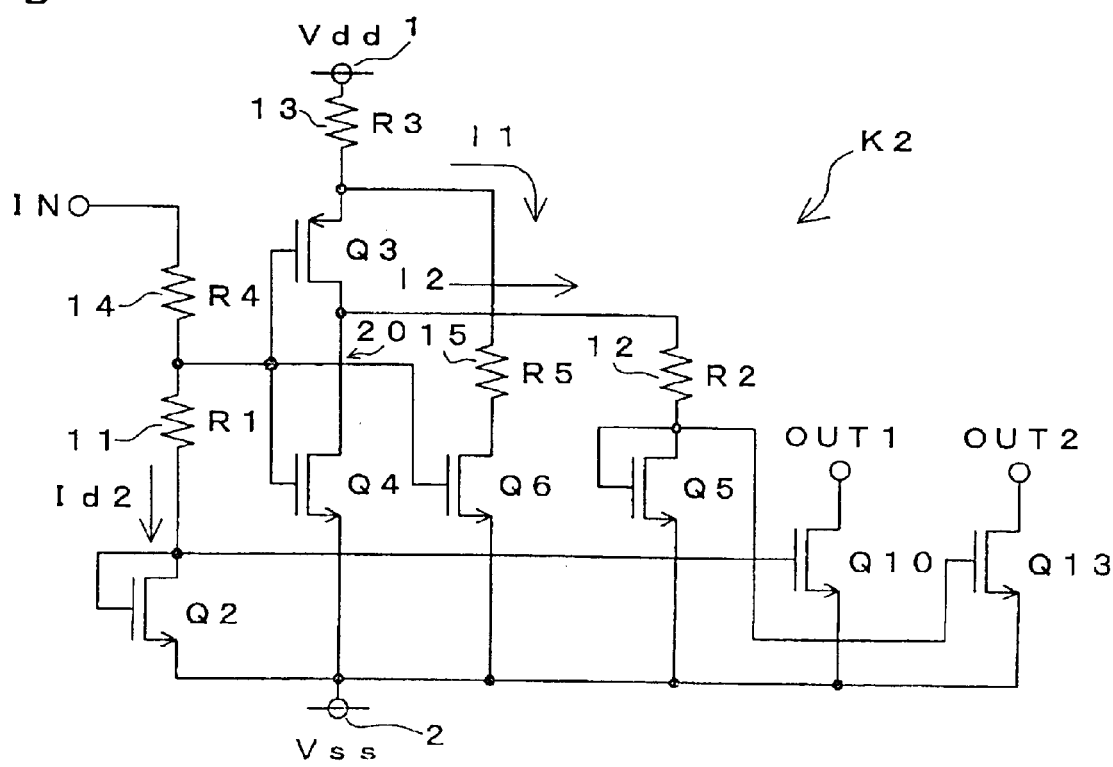
FIG. 2 is a circuit diagram of a current switching circuit according to a second embodiment of the present invention.

FIG. 2 shows a current switching circuit K2 according to a second embodiment of the present invention. In the current switching circuit K1 of the first embodiment, when the signal input terminal IN is at high level, a voltage applied across opposite ends of the resistance element 11 becomes smaller than a difference obtained by subtracting twice the threshold voltage Vth from the device breakdown voltage. If the device breakdown voltage is small, a potential difference between the opposite ends of the resistance element 11 approximates to zero and thus, it is extremely difficult to determine the first electric current I1 by the resistance element 11.

Therefore, in this embodiment, a resistance element 14 having a resistance R4 is inserted between the signal input terminal IN and the resistance element 11 in place of the n-channel MOS transistor Q1 of the current switching circuit K1. By replacing the transistor Q1 with the resistance element 14, the first current mirror circuit including the resistance element 11 and the transistors Q2 and Q10 is isolated from the resistance element 13, so that an electric current Id2 flowing through the on-state transistor Q2 is different from the first electric current I1 flowing through the resistance element 13. Hence, the electric current Id2 does not contribute to voltage drop at the resistance element 13. Therefore, in order to carry the first electric current I1, a current path which is constituted by a resistance element 15 having a resistance R5 and an n-channel MOS transistor Q6 is provided in the current switching circuit K2. Since other configurations of the current switching circuit K2 are similar to those of the current switching circuit K1 of FIG. 1, the description is abbreviated for the sake of brevity.

Hence, In case the signal input terminal IN is at high level upon reception of, for example, the positive voltage Vdd, the electric current Id2 flowing through the transistor Q2 is determined by a series resistance of the resistances R1 and R4 and a voltage applied across opposite ends of the series resistance. Since the voltage applied across the opposite ends of the series resistance becomes larger by the single threshold voltage Vth than that of the first embodiment, the electric current Id2 flowing through the transistor Q2 can be set easily.

In case the signal input terminal IN is at high level upon reception of, for example, the positive voltage Vdd, a gate terminal of the transistor Q6, which is connected to a junction of the resistance elements 11 and 14, and a gate-source voltage of the transistor Q6 is not less than the threshold voltage Vth, so that the first electric current I1 flows through the transistor Q6. On the contrary, in case the signal input terminal IN is at low level upon reception of, for example, the negative terminal Vss, the transistors Q2 and Q6 are turned off and the transistor Q5 is turned on, so that the second electric current I2 flows through the transistor Q5 in the same manner as the first embodiment.

By optimizing the resistance R5, the first electric current I1 and the second electric current I2 can be set equal to each other. The resistance element 14 also guarantees that a voltage of gate terminals of the transistors Q3 and Q4, namely, an input voltage of the CMOS inverter 20 does not rise to Vdd.

In this embodiment, if a voltage drop at the resistance element 14 and a voltage drop at the resistance element 13 are set equal to each other, it is possible to neglect the constraint of the first embodiment that the resistance R3 should be selected such that the product of the first electric current I1 and the resistance R3 or the product of the second electric current I2 and the resistance R3 is not more than the device breakdown voltage.

Therefore, in this embodiment, not only the electric current Id2 flowing through the transistor Q2 can be set more easily than the first embodiment but at any supply voltage not less than the breakdown voltage of the transistors Q3 and Q4, the transistors Q3 and Q4 can be used without breakdown of the transistors Q3 and Q4.

Meanwhile, in this embodiment, even if a supply voltage not less than the breakdown voltage of the transistors Q3 and Q4 is used, it is guaranteed that the transistors Q3 and Q4 operate at all times in a bias state not more than the breakdown voltage.

Furthermore, in this embodiment, it is possible to gain a desired voltage drop by the resistance element 13 irrespective of the input signal applied to the signal input terminal IN.

Third Embodiment

Figure 3:
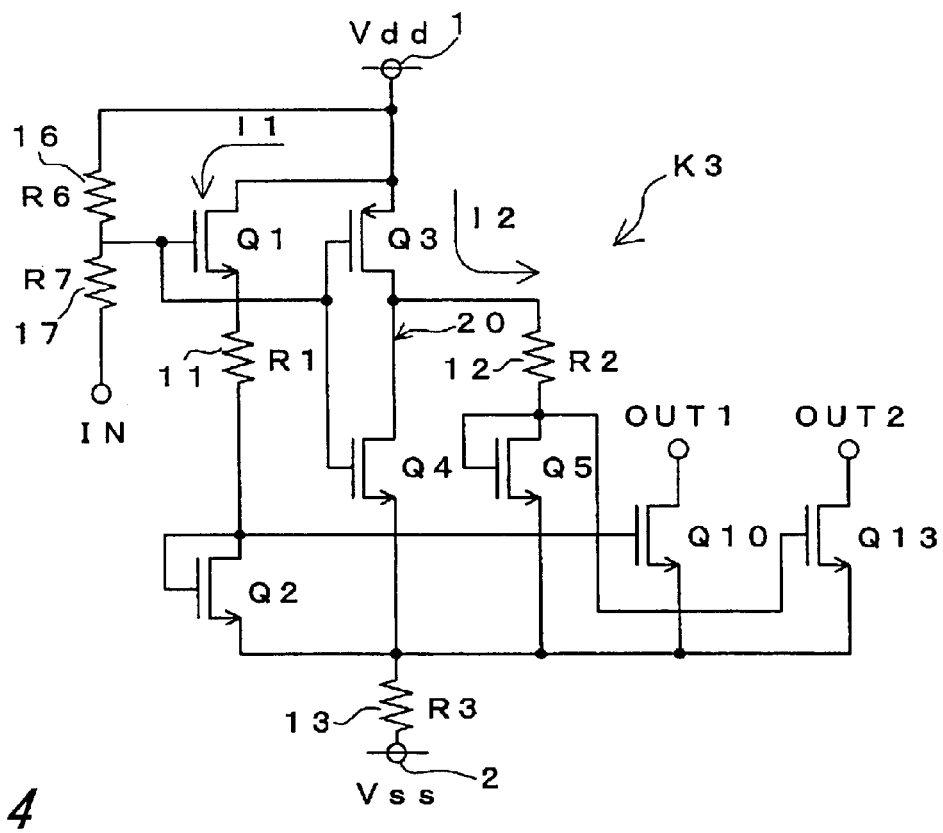
FIG. 3 is a circuit diagram of a current switching circuit according to a third embodiment of the present invention.

FIG. 3 shows a current switching circuit K3 according to a third embodiment of the present invention. In this current switching circuit K3, the resistance element 13 is inserted between the negative power source 2 and the transistor Q4. A series circuit of a resistance element 16 having a resistance R6 and a resistance element 17 having a resistance R7 acts as a bias circuit for guaranteeing a gate voltage of the transistor Q1 such that a gate-drain voltage Vgd1 of the transistor Q1 is not more than the device breakdown voltage regardless of the input signal applied to the signal input terminal IN. If a gate terminal of the transistor Q1 is set at Vss without providing this bias circuit, the gate-drain voltage Vgd1 of the transistor Q1 naturally becomes not less than the breakdown voltage BVgd of the transistor Q1, thereby resulting in breakdown of the transistor Q1. Since other configurations of the current switching circuit K3 are similar to those of the current switching circuit K1 of FIG. 1, the description is abbreviated for the sake of brevity.

In case a level shift amount Vr6 at the resistance element 16 is not more than the breakdown voltage BVgd of the transistor Q1 and the signal input terminal IN is at low level upon reception of, for example, the negative voltage Vss, the resistance R6 of the resistance element 16 and the resistance R7 of the resistance element 17 are set such that a potential difference Vr3 at the resistance element 13 and a potential difference Vr7 at the resistance element 17 are substantially equal to each other. Namely, the resistance R6 of the resistance element 16 and the resistance R7 of the resistance element 17 are set such that relations of $\{Vr6=R6/(R6+R7)\cdot(Vdd-Vss)<BVgd\}$ and $(Vr7 \approx R3 \times I2)$ are satisfied. Thus, not only for any input signal applied to the signal input terminal IN, it is possible to guarantee that the gate-drain voltage Vgd1 of the transistor Q1 satisfies a relation of $(Vgd1=Vr6<BVgd)$ but the supply voltage can be raised.

In this embodiment, even if a supply voltage not less than the breakdown voltage of the transistors Q3 and Q4 is used, it is guaranteed that the transistors Q3 and Q4 operate at all times in a bias state not more than the breakdown voltage.

Meanwhile, in this embodiment, at any supply voltage not less than the breakdown voltage of the transistors Q3 and Q4, the transistors Q3 and Q4 can be used without breakdown of the transistors Q3 and Q4.

Fourth Embodiment

Figure 4:
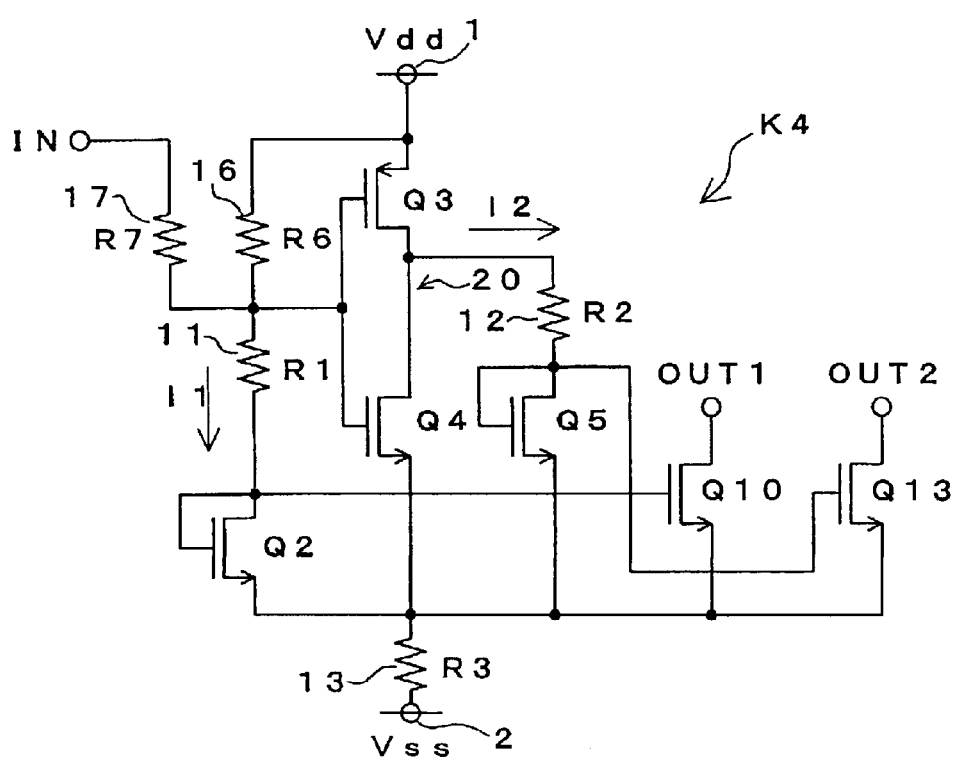
FIG. 4 is a circuit diagram of a current switching circuit according to a fourth embodiment of the present invention.

FIG. 4 shows a current switching circuit K4 according to a fourth embodiment of the present invention. This current switching circuit K4 has a configuration in which the gate terminal and a source terminal of the transistor Q1 are short-circuited to each other and the transistor Q1 is eliminated in the current switching circuit K3 of FIG. 3. In case the signal input terminal IN is at high level upon reception of, for example, the positive voltage Vdd on the supposition that "Vds2" denotes a drain-source voltage of the transistor Q2, the first electric current I1 flowing through the transistor Q2 is determined by a combined resistance of the resistances R6 and R7 and the resistance R1 and a voltage of (Vdd−Vss−Vds2) applied across opposite ends of the combined resistance.

Even if a voltage across opposite ends of the resistance element 11 cannot be secured sufficiently in the current switching circuit K3, the voltage applied across the opposite ends of the combined resistance becomes larger by the single threshold voltage Vth than the third embodiment by employing the above mentioned configuration in this embodiment, so that the first electric current I1 flowing through the transistor Q2 can be set easily.

In case the signal input terminal IN is at high level upon reception of, for example, the positive voltage Vdd, the resistance R6 of the resistance element 16 and the resistance R7 of the resistance element 17 are set such that the desired first electric current I1 is obtained from the following equation by using the combined resistance of the resistances R6 and R7 and the resistance R1.

$$I1=(Vdd-Vss-Vds2)/\{R1+R6 \cdot R7/(R6+R7)\}$$

In case the signal input terminal IN is at low level upon reception of, for example, the negative voltage Vss, the resistance R6 of the resistance element 16 and the resistance R7 of the resistance element 17 are set such that not only the level shift amount Vr6 at the resistance element 16 is not more than the device breakdown voltage BVgd but the level shift amount Vr3 at the resistance element 13 and the level shift amount Vr7 at the resistance element 17 are substantially equal to each other, namely, relations of {Vr6=R6/(R6+R7)·(Vdd−Vss)<BVgd} and (Vr7≈R3×I2) are satisfied.

In this embodiment, even if a supply voltage not less than the breakdown voltage of the transistors Q3 and Q4 is used, it is guaranteed that the transistors Q3 and Q4 operate at all times in a bias state not more than the breakdown voltage.

Meanwhile, in this embodiment, at any supply voltage not less than the breakdown voltage of the transistors Q3 and Q4, the transistors Q3 and Q4 can be used without breakdown of the transistors Q3 and Q4.

Fifth Embodiment

Figure 5:
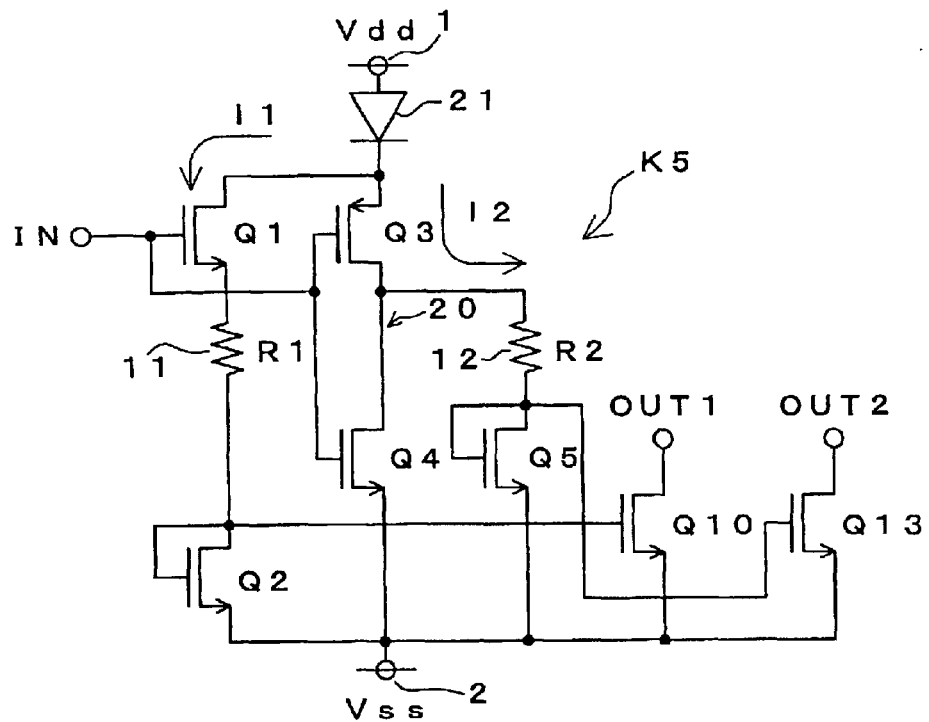
FIG. 5 is a circuit diagram of a current switching circuit according to a fifth embodiment of the present invention.

FIG. 5 shows a current switching circuit K5 according to a fifth embodiment of the present invention. In this current switching circuit K5, the resistance element 13 acting as the level shift element in the current switching circuit K1 of FIG. 1 is replaced by a diode 21. The diode 21 is, for example, constituted by $n^+$ source and drain electrodes and a p-well of an n-channel MOS transistor or $p^+$ source and drain electrodes and an n-well of a p-channel MOS transistor. Also in the current switching circuit K5, effects similar to those of the first embodiment can be gained.

In the current switching circuit K5, a maximum permissible supply voltage is improved by a level shift amount Vdio of the diode 21, for example, 0.7 V, over a conventional circuit. In case a larger supply voltage is used, the same effects can be obtained by connecting a plurality of the diodes 21 to each other in series.

In this embodiment, even if the supply voltage not less than the breakdown voltage of the transistors Q1, Q3 and Q4 is used, it is guaranteed that the transistors Q1, Q3 and Q4 operate at all times in the bias state not more than the breakdown voltage.

Sixth Embodiment

Figure 6:
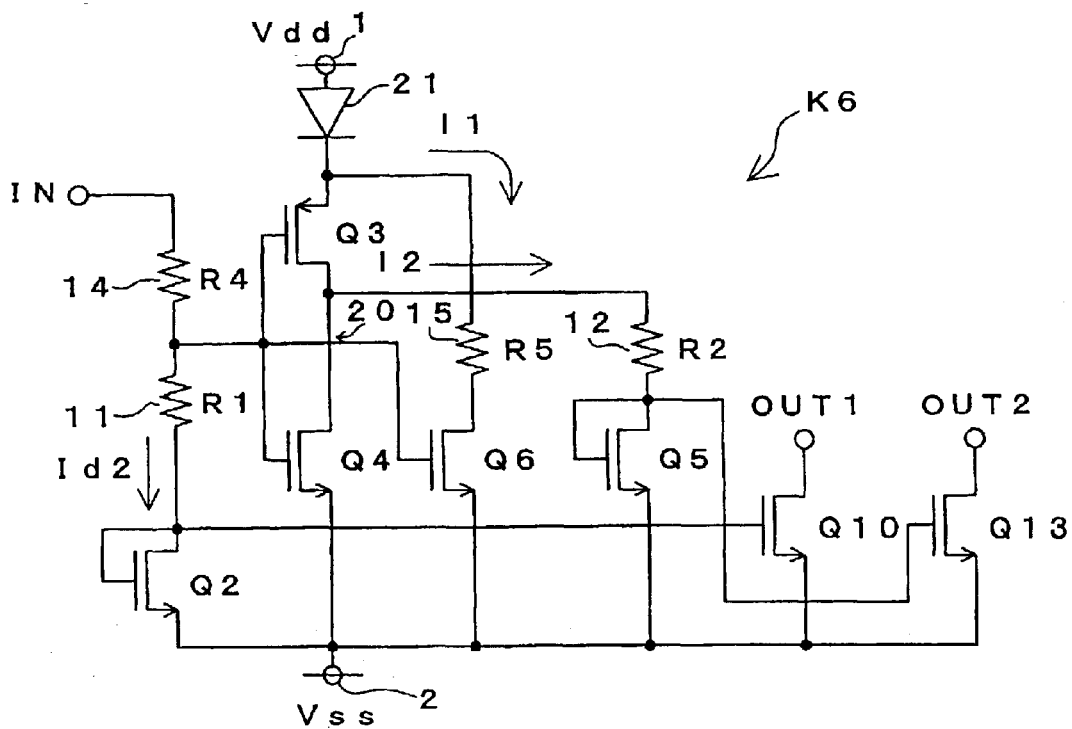
FIG. 6 is a circuit diagram of a current switching circuit according to a sixth embodiment of the present invention.

FIG. 6 shows a current switching circuit K6 according to a sixth embodiment of the present invention. In this current switching circuit K6, the resistance element 13 acting as the level shift element in the current switching circuit K2 of FIG. 2 is replaced by the diode 21. Also in the current switching circuit K6, effects similar to those of the second embodiment can be achieved.

The resistance R4 of the resistance element 14 is set such that a voltage Vr4 (=R4×Id2) across opposite ends of the resistance element 14 at the time the signal input terminal IN is at high level upon reception of, for example, the positive voltage Vdd is substantially equal to the level shift amount Vdio of the diode 21. Thus, a maximum permissible supply voltage of the current switching circuit K6 is improved by the level shift amount Vdio of the diode 21, for example, 0.7 V, over a conventional circuit.

In case a larger supply voltage is used, the same effects can be obtained by connecting a plurality of the diodes 21 to each other in series. In this case, the resistance R4 of the resistance element 14 is set such that the voltage Vr4 across the opposite ends of the resistance element 14 at the time the signal input terminal IN is at high level upon reception of, for example, the positive voltage Vdd is substantially equal to a level shift amount Vdiot of a plurality of the diodes 21 connected to each other in series. For example, in case the two diodes 21 are connected to each other in series, a relation of (Vdiot=Vdio×2≈R4×Id2) is obtained.

In this embodiment, even if a supply voltage not less than the breakdown voltage of the transistors Q3 and Q4 is used, it is guaranteed that the transistors Q3 and Q4 operate at all times in a bias state not more than the breakdown voltage.

Meanwhile, in this embodiment, a desired voltage drop can be obtained by the diode 21 irrespective of the input signal applied to the signal input terminal IN.

Moreover, in this embodiment, at any supply voltage not less than the breakdown voltage of the transistors Q3 and Q4, the transistors Q3 and Q4 can be used without breakdown of the transistors Q3 and Q4.

Seventh Embodiment

Figure 7:
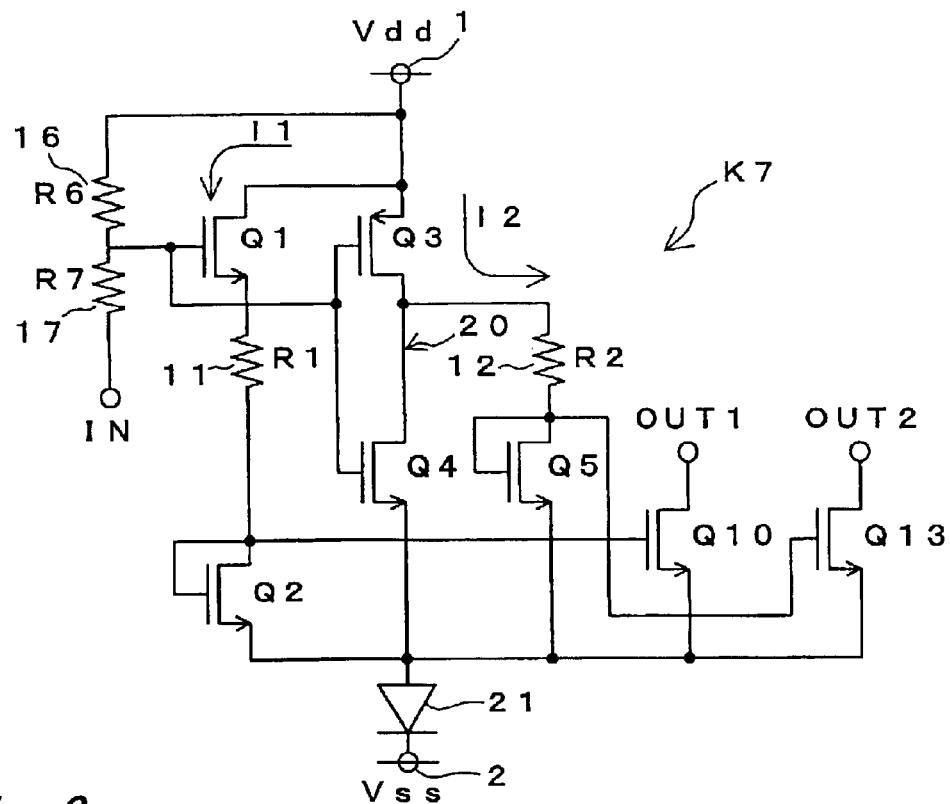
FIG. 7 is a circuit diagram of a current switching circuit according to a seventh embodiment of the present invention.

FIG. 7 shows a current switching circuit K7 according to a seventh embodiment of the present invention. In this current switching circuit K7, the resistance element 13 acting as the level shift element in the current switching circuit K3 of FIG. 3 is replaced by the diode 21. Also in the current switching circuit K7, effects similar to those of the third embodiment can be obtained.

The resistance R6 of the resistance element 16 and the resistance R7 of the resistance element 17 are set such that not only the level shift amount Vr6 of the resistance element 16 is not more than the device breakdown voltage BVgd but the voltage Vr7 {=R7/(R6+R7)·(Vdd−Vss)} across opposite ends of the resistance element 17 at the time the input signal terminal IN is at low level upon reception of, for example, the negative voltage Vss is substantially equal to the level shift amount Vdio of the diode 21. Thus, a maximum permissible supply voltage of the current switching circuit K7 is improved by the level shift amount Vdio of the diode 21, for example, 0.7 V, over a conventional circuit.

In case a larger supply voltage is used, the same effects can be obtained by connecting a plurality of the diodes 21 to each other in series. In this case, the resistance R7 of the resistance element 17 is set such that the voltage Vr7 across the opposite ends of the resistance element 17 at the time the signal input terminal IN is at low level upon reception of, for example, the negative voltage Vss is substantially equal to the level shift amount Vdiot of a plurality of the diodes 21 connected to each other in series. For example, in case the two diodes 21 are connected to each other in series, a relation of {Vdiot=Vdio×2≈Vr7=R7/(R6+R7)·(Vdd−Vss)} is obtained.

In this embodiment, even if a supply voltage not less than the breakdown voltage of the transistors Q3 and Q4 is used, it is guaranteed that the transistors Q3 and Q4 operate at all times in a bias state not more than the breakdown voltage.

Meanwhile, in this embodiment, at any supply voltage not less than the breakdown voltage of the transistors Q3 and Q4, the transistors Q3 and Q4 can be used without breakdown of the transistors Q3 and Q4.

Eighth Embodiment

Figure 8:
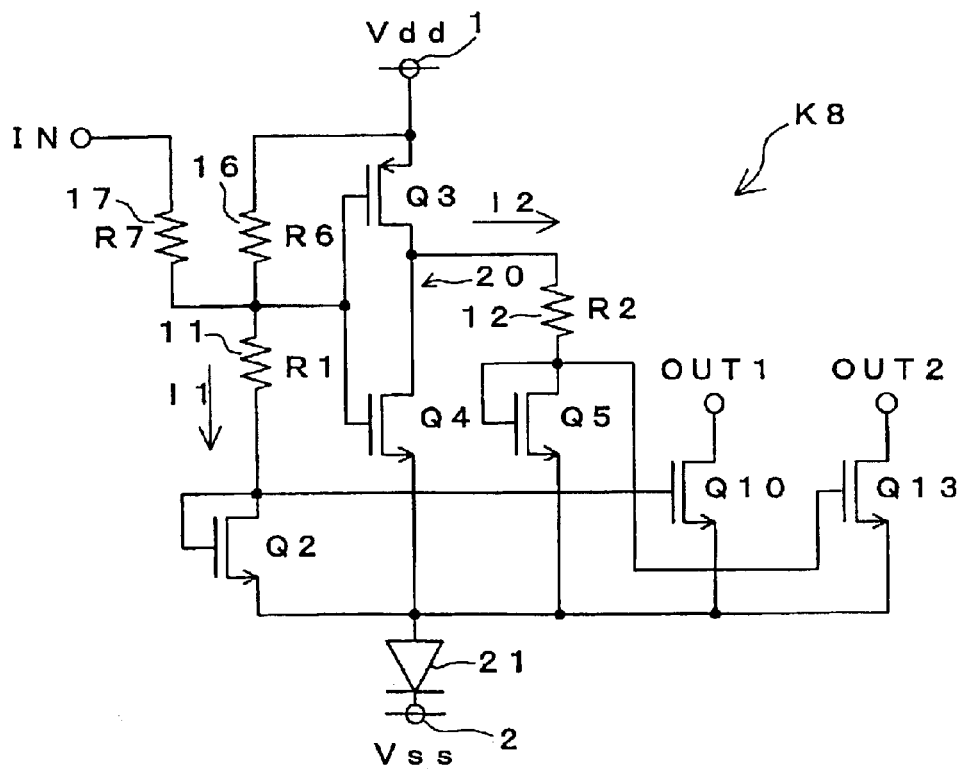
FIG. 8 is a circuit diagram of a current switching circuit according to an eighth embodiment of the present invention.

FIG. 8 shows a current switching circuit K8 according to an eighth embodiment of the present invention. In this current switching circuit K8, the resistance element 13 acting as the level shift element in the current switching circuit K4 of FIG. 4 is replaced by the diode 21. Also in the current switching circuit K8, effects similar to those of the fourth embodiment can be obtained In case the signal input terminal IN is at high level upon reception of, for example, the positive voltage Vdd, the resistance R1 of the resistance element 11, the resistance R6 of the resistance element 16 and the resistance R7 of the resistance element 17 are set such that the desired first electric current I1 is obtained from the combined resistance of the resistances R6 and R7 and the resistance R1 by the following equation.

$$I1=(Vdd-Vss-Vds2)/\{R1+R6\cdot R7/(R6+R7)\}$$

In case the signal input terminal IN is at low level upon reception of, for example, the negative voltage Vss, the resistance R1 of the resistance element 11, the resistance R6 of the resistance element 16 and the resistance R7 of the resistance element 17 are set such that the level shift amount Vr6 at the resistance element 16 is not more than the device breakdown voltage BVgd and the voltage Vr7 across the opposite ends of the resistance element 17 is substantially equal to the level shift amount Vdio at the diode 21, namely, relations of $\{Vr6=R6/(R6+R7)\cdot(Vdd-Vss)<BVgd\}$ and $(Vr7\approx Vdio)$ are satisfied. Thus, a maximum permissible supply voltage of the current switching circuit K8 is improved by the level shift amount Vdio of the diode 21, for example, 0.7 V, over a conventional circuit.

In case a larger supply voltage is used, the same effects can be obtained by connecting a plurality of the diodes 21 to each other in series. In this case, the resistance R7 of the resistance element 17 is set such that the voltage Vr7 across the opposite ends of the resistance element 17 at the time the signal input terminal IN is at low level upon reception of, for example, the negative voltage Vss is substantially equal to the level shift amount Vdiot of a plurality of the diodes 21 connected to each other in series. For example, in case the two diodes 21 are connected to each other in series, a relation of $\{Vdiot=Vdio\times 2\approx Vr7=R7/(R6+R7)\cdot(Vdd-Vss)\}$ is obtained.

In this embodiment, even if a supply voltage not less than the breakdown voltage of the transistors Q3 and Q4 is used, it is guaranteed that the transistors Q3 and Q4 operate at all times in a bias state not more than the breakdown voltage.

Meanwhile, in this embodiment, at any supply voltage not less than the breakdown voltage of the transistors Q3 and Q4, the transistors Q3 and Q4 can be used without breakdown of the transistors Q3 and Q4.

Ninth Embodiment

Figure 9:
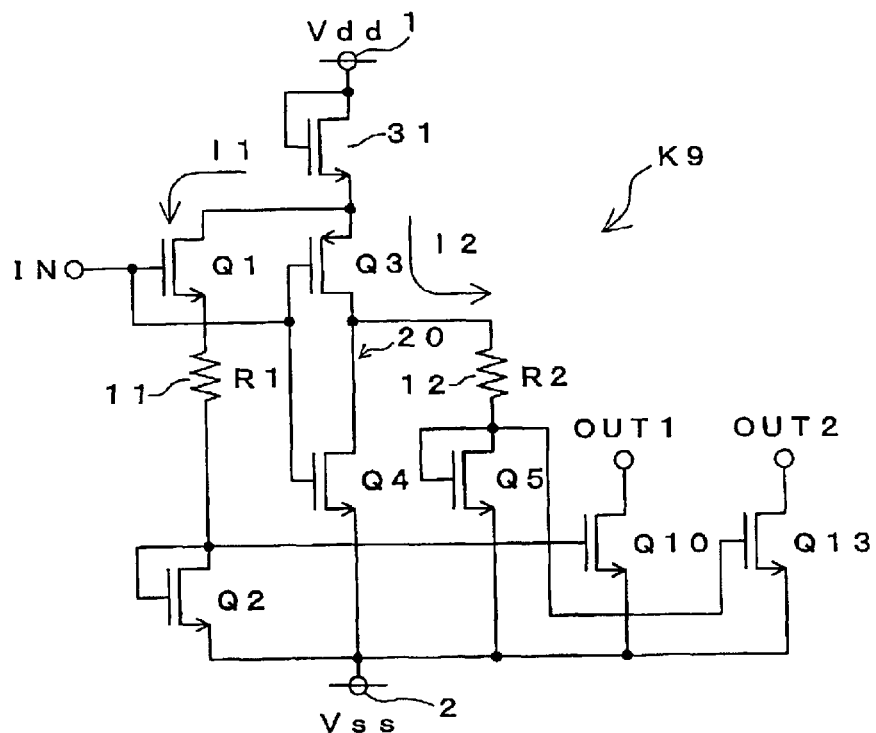
FIG. 9 is a circuit diagram of a current switching circuit according to a ninth embodiment of the present invention.

FIG. 9 shows a current switching circuit K9 according to a ninth embodiment of the present invention. In this current switching circuit K9, the resistance element 13 acting as the level shift element in the current switching circuit K1 of FIG. 1 is replaced by an n-channel MOS transistor 31 in which a gate terminal and a drain terminal are short-circuited to each other. Also in the current switching circuit K9, effects similar to those of the first embodiment can be obtained.

A maximum permissible supply voltage of the current switching circuit K9 is improved by a level shift amount (>threshold voltage) of the n-channel MOS transistor 31 over a conventional circuit. In case a larger supply voltage is used, the same effects can be gained by connecting a plurality of the n-channel MOS transistors 31 to each other in series.

In this embodiment, even if the supply voltage not less than the breakdown voltage of the transistors Q1, Q3 and Q4 is used, it is guaranteed that the transistors Q1, Q3 and Q4 operate at all times in the bias state not more than the breakdown voltage.

Tenth Embodiment

Figure 10:
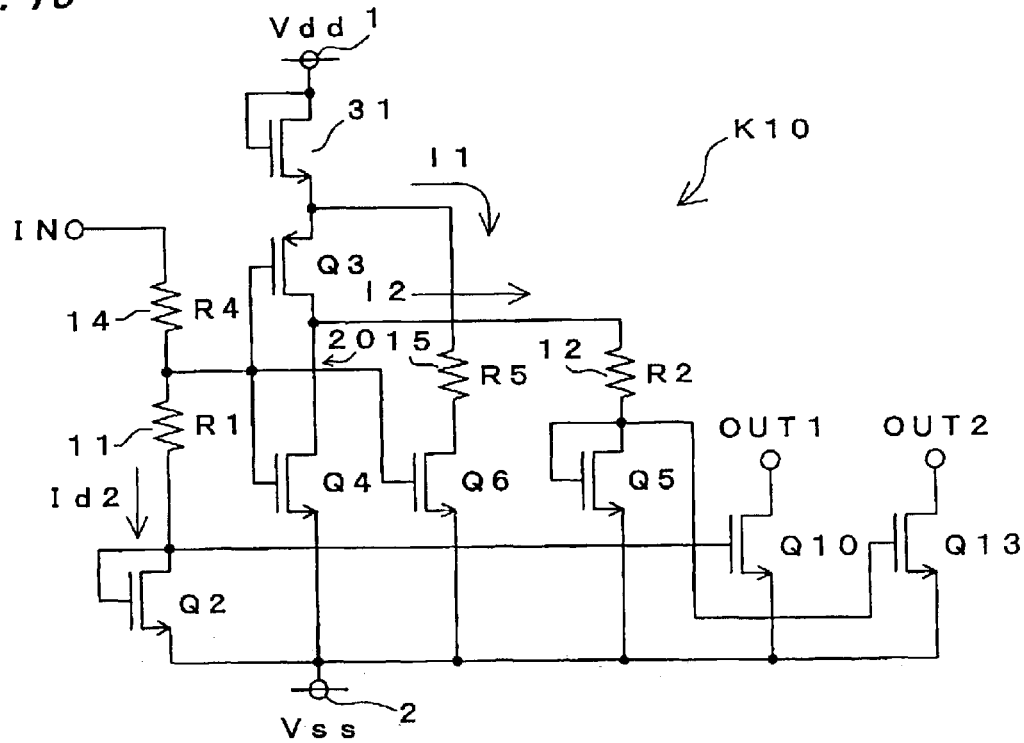
FIG. 10 is a circuit diagram of a current switching circuit according to a tenth embodiment of the present invention.

FIG. 10 shows a current switching circuit K10 according to a tenth embodiment of the present invention. In this current switching circuit K10, the resistance element 13 acting as the level shift element in the current switching circuit K2 of FIG. 2 is replaced by the n-channel MOS transistor 31 in which the gate terminal and the drain terminal are short-circuited to each other. Also in the current switching circuit K10, effects similar to those of the second embodiment can be obtained. The resistance R4 of the resistance element 14 is set such that the voltage across the opposite ends of the resistance element 14 at the time the signal input terminal IN is at high level upon reception of, for example, the positive voltage Vdd is substantially equal to the level shift amount of the n-channel MOS transistor 31. Hence, a maximum permissible supply voltage of the current switching circuit K10 is improved by the level shift amount (>threshold voltage) of the n-channel MOS transistor 31 over a conventional circuit.

In case a larger supply voltage is used, the same effects can be achieved by connecting a plurality of the n-channel MOS transistors 31 to each other in series. In this case, the resistance element R4 of the resistance element 14 is set such that the voltage across the opposite ends of the resistance element 14 at the time the signal input terminal IN is at high level upon reception of, for example, the positive voltage Vdd is substantially equal to a level shift amount of a plurality of the n-channel MOS transistors 31 connected to each other in series.

In this embodiment, even if a supply voltage not less than the breakdown voltage of the transistors Q3 and Q4 is used, it is guaranteed that the transistors Q3 and Q4 operate at all times in a bias state not more than the breakdown voltage.

Meanwhile, in this embodiment, it is possible to gain a desired voltage drop by the n-channel MOS transistor 31 regardless of the input signal applied to the signal input terminal IN.

Furthermore, in this embodiment, at any supply voltage not less than the breakdown voltage of the transistors Q3 and Q4, the transistors Q3 and Q4 can be used without breakdown of the transistors Q3 and Q4.

Eleventh Embodiment

Figure 11:
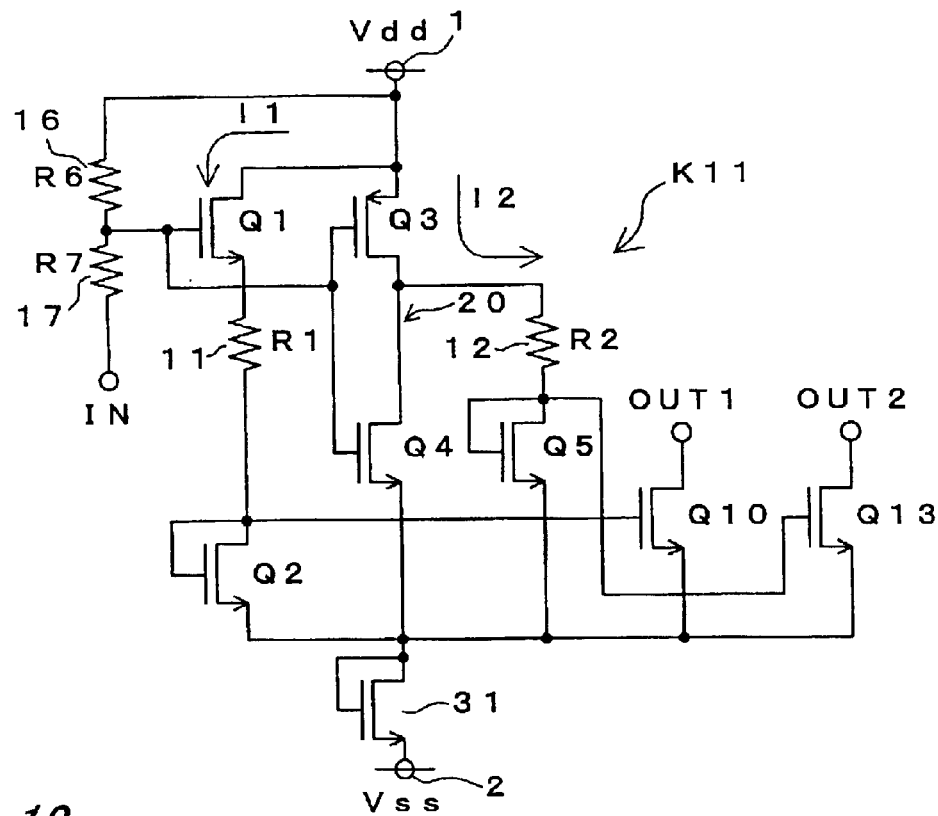
FIG. 11 is a circuit diagram of a current switching circuit according to an eleventh embodiment of the present invention.

FIG. 11 shows a current switching circuit K11 according to an eleventh embodiment of the present invention. In this current switching circuit K11, the resistance element 13 acting as the level shift element in the current switching circuit K3 of FIG. 3 is replaced by the n-channel MOS transistor 31 in which the gate terminal and the drain terminal are short-circuited to each other. Also in the current switching circuit K11, effects similar to those of the third embodiment can be obtained☐

The resistance R6 of the resistance element 16 and the resistance R7 of the resistance element 17 are set such that the voltage across the opposite ends of the resistance element 17 at the time the input signal terminal IN is at low level upon reception of, for example, the negative voltage Vss is substantially equal to the level shift amount of the n-channel MOS transistor 31. Hence, a maximum permissible supply voltage of the current switching circuit K10 is improved by the level shift amount (>threshold voltage) of the n-channel MOS transistor 31 over a conventional circuit.

In case a larger supply voltage is used, the same effects can be achieved by connecting a plurality of the n-channel MOS transistors 31 to each other in series. In this case, the resistance element R6 of the resistance element 16 and the resistance R7 of the resistance element 17 are set such that the voltage across the opposite ends of the resistance element 17 at the time the signal input terminal IN is at low level upon reception of, for example, the negative voltage Vss is substantially equal to a level shift amount of a plurality of the n-channel MOS transistors 31 connected to each other in series.

In this embodiment even if a supply voltage not less than the breakdown voltage of the transistors Q3 and Q4 is used, it is guaranteed that the transistors Q3 and Q4 operate at all times in a bias state not more than the breakdown voltage.

Meanwhile, In this embodiment, at any supply voltage not less than the breakdown voltage of the transistors Q3 and Q4, the transistors Q3 and Q4 can be used without breakdown of the transistors Q3 and Q4.

Twelfth Embodiment

Figure 12:
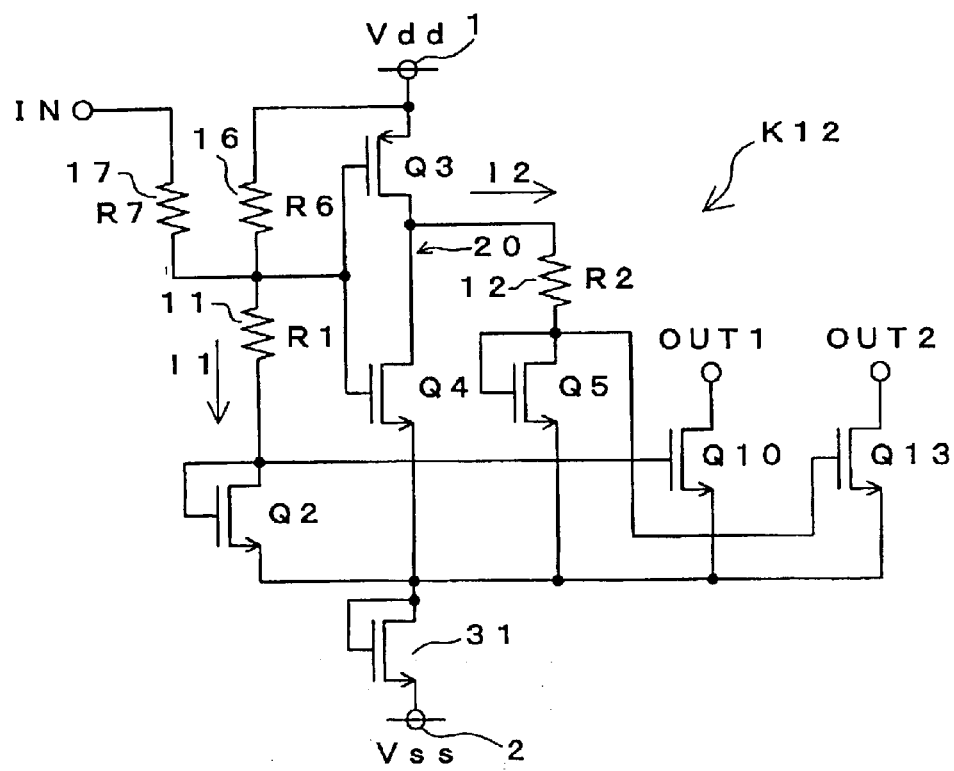
FIG. 12 is a circuit diagram of a current switching circuit according to a twelfth embodiment of the present invention.

FIG. 12 shows a current switching circuit K12 according to a twelfth embodiment of the present invention. In this current switching circuit K12, the resistance element 13 acting as the level shift element in the current switching circuit K4 of FIG. 4 is replaced by the n-channel MOS transistor 31 in which the gate terminal and the drain terminal are short-circuited to each other. Also in the current switching circuit K12, effects similar to those of the fourth embodiment can be obtained.

The resistance R1 of the resistance element 11, the resistance R6 of the resistance element 16 and the resistance R7 of the resistance element 17 are set such that the voltage across the opposite ends of the resistance element 17 at the time the signal input terminal IN is at low level upon reception of, for example, the negative voltage Vss is substantially equal to the level shift amount of the n-channel MOS transistor 31. Hence, a maximum permissible supply voltage of the current switching circuit K12 is improved by the level shift amount (>threshold voltage) of the n-channel MOS transistor 31 over a conventional circuit.

In case a larger supply voltage is used, the same effects can be achieved by connecting a plurality of the n-channel MOS transistors 31 to each other in series. In this case, the resistance R1 of the resistance element 11, the resistance element R6 of the resistance element 16 and the resistance R7 of the resistance element 17 are set such that the voltage across the opposite ends of the resistance element 17 at the time the signal input terminal IN is at low level upon reception of, for example, the negative voltage Vss is substantially equal to a level shift amount of a plurality of the n-channel MOS transistors 31 connected to each other in series.

In this embodiment, even if a supply voltage not less than the breakdown voltage of the transistors Q3 and Q4 is used, it is guaranteed that the transistors Q3 and Q4 operate at all times in a bias state not more than the breakdown voltage.

Meanwhile, in this embodiment, at any supply voltage not less than the breakdown voltage of the transistors Q3 and Q4, the transistors Q3 and Q4 can be used without breakdown of the transistors Q3 and Q4.

Thirteenth Embodiment

Figure 13:
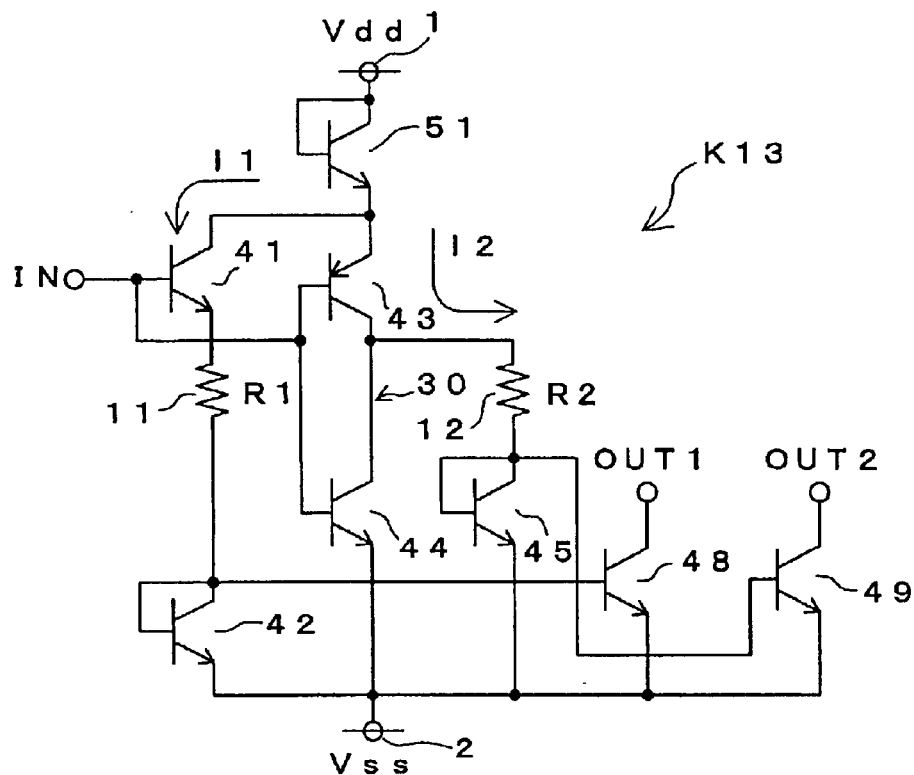
FIG. 13 is a circuit diagram of a current switching circuit according to a thirteenth embodiment of the present invention.

FIG. 13 shows a current switching circuit K13 according to a thirteenth embodiment of the present invention. In this current switching circuit K13, the p-channel MOS transistor and the n-channel MOS transistors in the current switching circuit K9 are, respectively, replaced by a pnp bipolar transistor and npn bipolar transistors, namely, the p-channel MOS transistor Q3 is replaced by a pnp bipolar transistor 43, while the n-channel MOS transistors 31, Q1–Q2, Q4–Q5, Q10 and Q13 are replaced by npn bipolar transistors 51, 41–42, 44–45, 48 and 49, respectively.

Therefore, the npn bipolar transistor 51 corresponding to the n-channel MOS transistor 31 of FIG. 9 acts as a level shift element, while the pnp bipolar transistor 43 and the npn bipolar transistor 44 corresponding to the p-channel MOS transistor Q3 and the n-channel MOS transistor Q4 in FIG. 9, respectively form a complementary circuit 30. Also in the current switching circuit K13, effects similar to those of the ninth embodiment can be obtained.

A maximum permissible supply voltage of the current switching circuit K13 is improved over a conventional circuit by a level shift amount of the npn bipolar transistor 51 in which a base terminal and a collector terminal are short-circuited to each other, i.e., a barrier voltage of, for example, 0.7 V.

In case a larger supply voltage is used, the same effects can be achieved by connecting a plurality of the npn bipolar transistors 51 to each other in series.

In this embodiment, even if a supply voltage not less than a breakdown voltage of the bipolar transistors 41, 43 and 44 is used, it is guaranteed that the bipolar transistors 41, 43 and 44 operate at all times in a bias state not more than the breakdown voltage.

Fourteenth Embodiment

Figure 14:
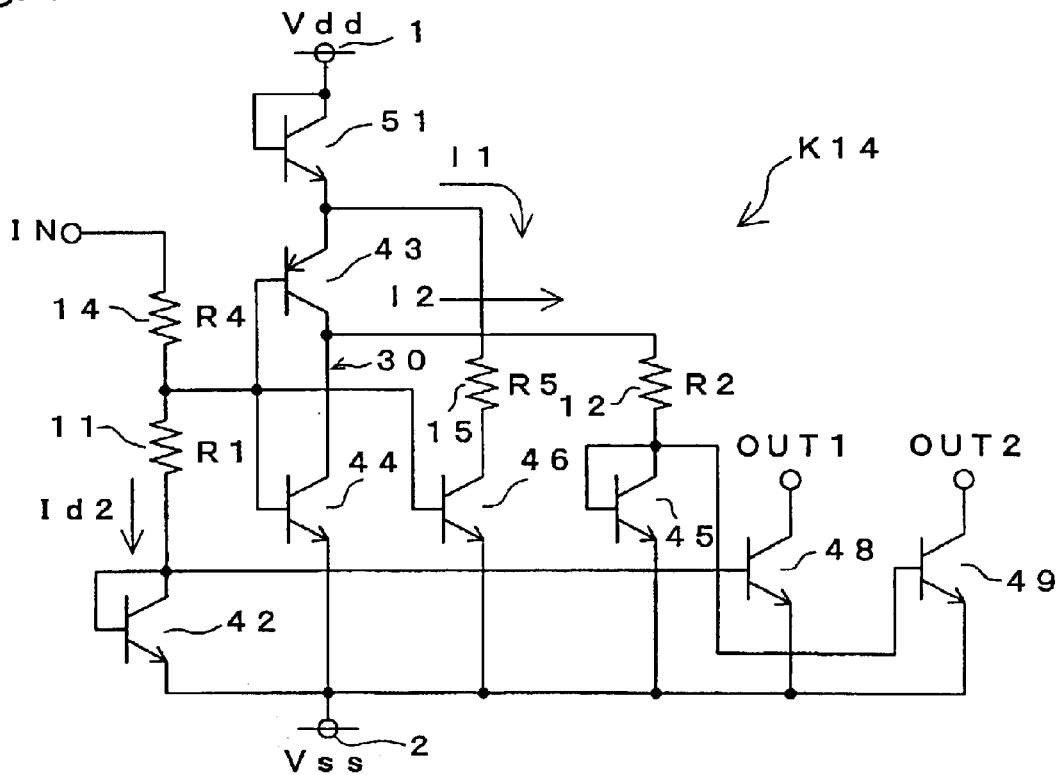
FIG. 14 is a circuit diagram of a current switching circuit according to a fourteenth embodiment of the present invention.

FIG. 14 shows a current switching circuit K14 according to a fourteenth embodiment of the present invention. In this current switching circuit K14, the p-channel MOS transistor and the n-channel MOS transistors in the current switching circuit K10 are, respectively, replaced by a pnp bipolar transistor and npn bipolar transistors in the same manner as the thirteenth embodiment, namely, the p-channel MOS transistor Q3 is replaced by the pnp bipolar transistor 43, while the n-channel MOS transistors 31, Q2, Q4–Q6, Q10 and Q13 are replaced by the npn bipolar transistors 51, 42, 44–46, 48 and 49, respectively.

Therefore, the npn bipolar transistor 51 corresponding to the n-channel MOS transistor 31 of FIG. 10 acts as a level shift element, while the pnp bipolar transistor 43 and the npn bipolar transistor 44 corresponding to the p-channel MOS transistor Q3 and the n-channel MOS transistor Q4 in FIG. 10, respectively form the complementary circuit 30. Also in the current switching circuit K14, effects similar to those of the tenth embodiment can be obtained.

A maximum permissible supply voltage of the current switching circuit K14 is improved over a conventional circuit by the level shift amount of the npn bipolar transistor 51 in which the base terminal and the collector terminal are short-circuited to each other, i.e., a barrier voltage of, for example, 0.7 V.

In case a larger supply voltage is used, the same effects can be achieved by connecting a plurality of the npn bipolar transistors 51 to each other in series.

In this embodiment, even if a supply voltage not less than a breakdown voltage of the bipolar transistors 43 and 44 is used, it is guaranteed that the bipolar transistors 43 and 44 operate at all times in a bias state not more than the breakdown voltage.

Meanwhile, in this embodiment, it is possible to gain a desired voltage drop by the npn bipolar transistor 51 regardless of the input signal applied to the signal input terminal IN.

Furthermore, in this embodiment, at any supply voltage not less than the breakdown voltage of the bipolar transistors 43 and 44, the bipolar transistors 43 and 44 can be used without breakdown of the bipolar transistors 43 and 44.

Fifteenth Embodiment

Figure 15:
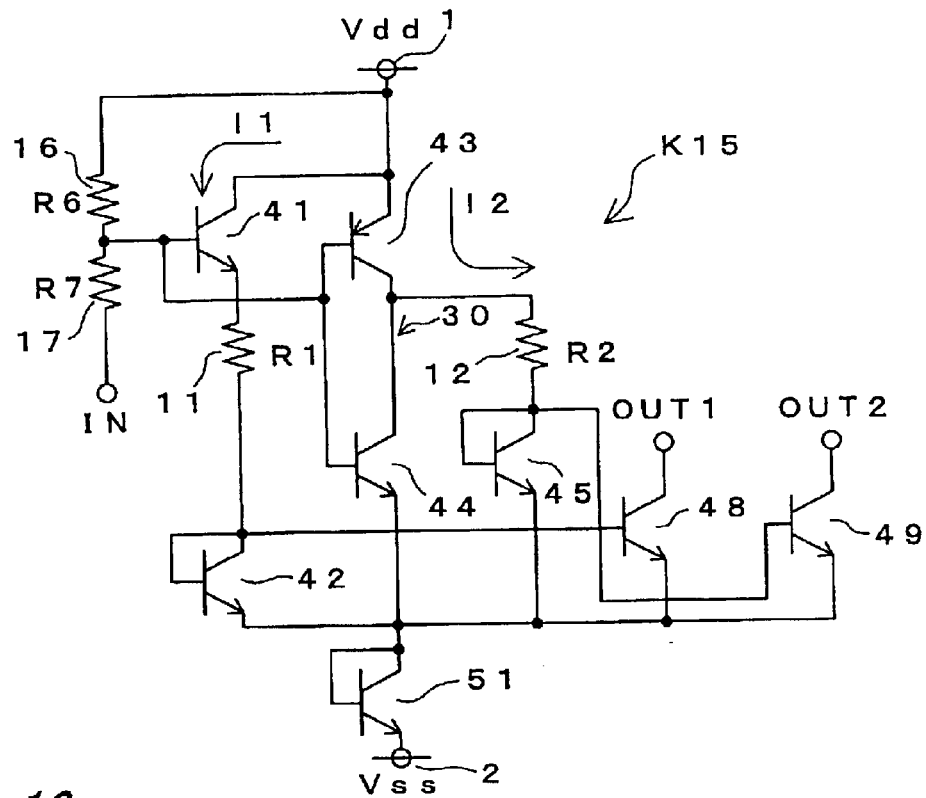
FIG. 15 is a circuit diagram of a current switching circuit according to a fifteenth embodiment of the present invention.

FIG. 15 shows a current switching circuit K15 according to a fifteenth embodiment of the present invention. In this current switching circuit K15, the p-channel MOS transistor and the n-channel MOS transistors in the current switching circuit K11 are, respectively, replaced by a pnp bipolar transistor and npn bipolar transistors in the same manner as the thirteenth embodiment, namely, the p-channel MOS transistor Q3 is replaced by the pnp bipolar transistor 43, while the n-channel MOS transistors 31, Q1–Q2, Q4–Q5, Q10 and Q13 are replaced by the npn bipolar transistors 51, 41–42, 44–45, 48 and 49, respectively.

Therefore, the npn bipolar transistor 51 corresponding to the n-channel MOS transistor 31 of FIG. 11 acts as a level shift element, while the pnp bipolar transistor 43 and the npn bipolar transistor 44 corresponding to the p-channel MOS transistor Q3 and the n-channel MOS transistor Q4 in FIG. 11, respectively form the complementary circuit 30. Also in the current switching circuit K15, effects similar to those of the eleventh embodiment can be obtained.

A maximum permissible supply voltage of the current switching circuit K15 is improved over a conventional circuit by the level shift amount of the npn bipolar transistor 51 in which the base terminal and the collector terminal are short-circuited to each other, i.e., a barrier voltage of, for example, 0.7 V.

In case a larger supply voltage is used, the same effects can be achieved by connecting a plurality of the npn bipolar transistors 51 to each other in series.

In this embodiment, even if a supply voltage not less than the breakdown voltage of the bipolar transistors 43 and 44 is used, it is guaranteed that the bipolar transistors 43 and 44 operate at all times in a bias state not more than the breakdown voltage.

Meanwhile, in this embodiment, at any supply voltage not less than the breakdown voltage of the bipolar transistors 43 and 44, the bipolar transistors 43 and 44 can be used without breakdown of the bipolar transistors 43 and 44.

Sixteenth Embodiment

Figure 16:
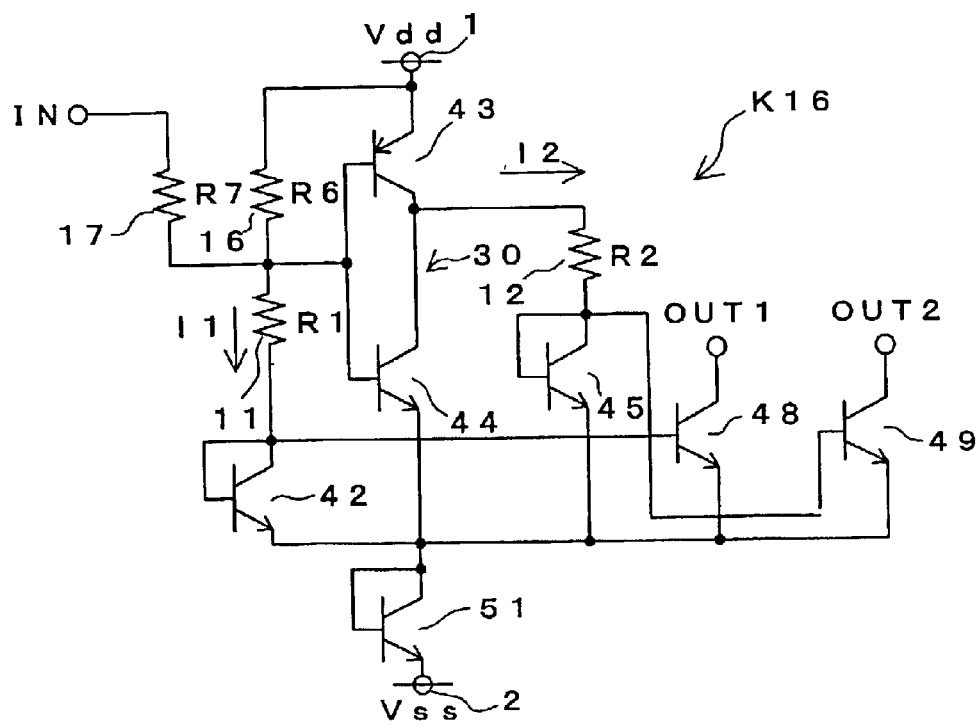
FIG. 16 is a circuit diagram of a current switching circuit according to a sixteenth embodiment of the present invention.

FIG. 16 shows a current switching circuit K16 according to a sixteenth embodiment of the present invention. In this current switching circuit K16, the p-channel MOS transistor and the n-channel MOS transistors in the current switching circuit K12 are, respectively, replaced by a pnp bipolar transistor and npn bipolar transistors in the same manner as the thirteenth embodiment, namely, the p-channel MOS transistor Q3 is replaced by the pnp bipolar transistor 43, while the n-channel MOS transistors 31, Q2, Q4–Q5, Q10 and Q13 are replaced by the npn bipolar transistors 51, 42, 44–45, 48 and 49, respectively.

Therefore, the npn bipolar transistor 51 corresponding to the n-channel MOS transistor 31 of FIG. 12 acts as a level shift element, while the pnp bipolar transistor 43 and the npn bipolar transistor 44 corresponding to the p-channel MOS transistor Q3 and the n-channel MOS transistor Q4 in FIG. 12, respectively form the complementary circuit 30. Also in the current switching circuit K16, effects similar to those of the twelfth embodiment can be obtained.

A maximum permissible supply voltage of the current switching circuit K16 is improved over a conventional circuit by the level shift amount of the npn bipolar transistor 51 in which the base terminal and the collector terminal are short-circuited to each other, i.e., a barrier voltage of, for example, 0.7 V.

In case a larger supply voltage is used, the same effects can be achieved by connecting a plurality of the npn bipolar transistors 51 to each other in series.

In this embodiment, even if a supply voltage not less than the breakdown voltage of the bipolar transistors 43 and 44 is used, it is guaranteed that the bipolar transistors 43 and 44 operate at all times in a bias state not more than the breakdown voltage.

Meanwhile, in this embodiment, at any supply voltage not less than the breakdown voltage of the bipolar transistors 43 and 44, the bipolar transistors 43 and 44 can be used without breakdown of the bipolar transistors 43 and 44.

As is dear from the foregoing description, the current switching circuit of the present invention includes a complementary circuit which is connected between a first power source and a second power source having a potential lower than that of the first power source. A first of a pair of current mirror circuits is connected to the complementary circuit. A level shift element is connected between one of the first and second power sources and the complementary circuit and imparts a predetermined voltage drop for the complementary circuit by virtue of the level shift current flowing through the level shift element. In response to the input signal at a first level, the complementary circuit switches the first current mirror circuit to the first state in which the first current mirror circuit is enabled by supplying the first current mirror current thereto and a second of the current mirror circuit is disabled by the input signal. When the input signal has a second level, the complementary circuit switches the first current mirror circuit to the second state in which the first current mirror circuit is disabled and the second current mirror circuit is enabled by the input signal and the second current mirror current is supplied thereto. At least one of the first and second current mirror currents flows through the level shift element as the level shift current regardless of whether the input signal has the first or second level.

Therefore, in accordance with the present invention, such marked effects are gained that even if a supply voltage not less than the breakdown voltage of the devices of the complementary circuit is used, it is guaranteed that the devices of the complementary circuit operate at all times in a biased state at a voltage not more than the breakdown voltage of the devices of the complementary circuit, the desired voltage drop is obtained by the level shift element regardless of the level of the input signal and at any supply voltage not less than the breakdown voltage of the devices of the complementary circuit, and the devices of the complementary circuit can be used without breakdown of the devices of the complementary circuit.

Furthermore, in accordance with the present invention, since the complementary circuit may be the CMOS inverter, power consumption of the current switching circuit is reduced.

What is claimed is:

1. A current switching circuit comprising:
    a complementary circuit connected between a first power source and a second power source having a voltage lower than that of the first power source;
    first and second current mirror circuits, the first current mirror circuit being connected to the complementary circuit;
    a first level shift element connected between the first power source and the complementary circuit, producing a voltage drop from the voltage output by the first power source to a voltage applied to the complementary circuit, through a level shift current flowing through the first level shift element;

an input resistor connected between an input terminal and an input of the complementary circuit;

a current path including a first transistor having a control electrode connected to the input of the complementary circuit, a first electrode coupled to the level shift element and a second electrode coupled to the second power source so that the current path extends between the first level shift element and the second power source for carrying a second current mirror current; and a second level shift element connected between the input of the complementary circuit and the second current mirror circuit, wherein in response to the input signal at a first level, the complementary circuit switches the first current mirror circuit to a first state in which the first current mirror circuit is enabled and a first current mirror current is supplied to the first current mirror circuit, and the second current mirror circuit is disabled, in response to the input signal at a second level, the complementary circuit switches the first current mirror circuit to a second state in which the first current mirror circuit is disabled, and the second current mirror circuit is enabled and the second current mirror current is supplied to the current path, and one of the first current mirror current and the second current mirror current flows through the first level shift element regardless of whether the input signal is at the first level or the second level.

2. The current switching circuit according to claim 1, wherein the complementary circuit includes a CMOS inverter.

3. The current switching circuit according to claim 1, wherein the level shift element is selected from the group consisting of a resistor, a diode, and a second transistor having a control electrode short circuited to another electrode of the second transistor.

4. A current switching circuit comprising:

a complementary circuit connected between a first power source and a second power source having a voltage lower than that of the first power source;

first and second current mirror circuits, the first current mirror circuit being connected to the complementary circuit;

a level shift element connected between the second power source and the complementary circuit and producing a voltage drop from the voltage output by the second power source to the voltage applied to the complementary circuit, through a level shift current flowing through the level shift element;

a biasing circuit connected between an input terminal of the current switching circuit and the first power source and including two series-connected resistors; and an input transistor having a control electrode connected to a junction of the two series-connected resistors, a first electrode connected to the first power source and a second electrode coupled to the second current mirror circuit, wherein in response to an input signal having a first level, the complementary circuit switches the first current mirror circuit to a first state in which the first current mirror circuit is enabled and a first current mirror current is supplied to the first current mirror circuit, and the second current mirror circuit is disabled, in response to the input signal having a second level, the complementary circuit switches the first current mirror circuit to a second state, in which the first current mirror circuit is disabled, and the second current mirror circuit is enabled and a second current mirror current is supplied to the second current mirror circuit, and one of the first current mirror current and the second current mirror current flows through the level shift element regardless of whether the input signal is at the first level or the second level.

5. The current switching circuit according to claim 4, wherein the complementary circuit includes a CMOS inverter.

6. The current switching circuit according to claim 4, wherein the level shift element is selected from the group consisting of a resistor, a diode, and a transistor having a control electrode short circuited to another electrode of the transistor.

7. A current switching circuit comprising:

a complementary circuit connected between a first power source and a second power source having a voltage lower than that of the first power source;

first and second current mirror circuits, the first current mirror circuit being connected to the complementary circuit;

a level shift element connected between the second power source and the complementary circuit and producing a voltage drop from the voltage output by the second power source to the voltage applied to the complementary circuit, through a level shift current flowing through the level shift element;

a bias circuit including first and second series-connected resistors connected between the first power source and the second current mirror circuit; and an input resistor connected between an input terminal and a junction of the first and second series-connected resistors and connected to the complementary circuit, wherein in response to an input signal having a first level, the complementary circuit switches the first current mirror circuit to a first state in which the first current mirror circuit is enabled and a first current mirror current is supplied to the first current mirror circuit, and the second current mirror circuit is disabled, in response to the input signal having a second level, the complementary circuit switches the first current mirror circuit to a second state in which the first current mirror circuit is disabled, and the second current mirror circuit is enabled and a second current mirror current is supplied to the second current mirror circuit, and one of the first current mirror current and the second current mirror current flows through the level shift element regardless of whether the input signal is at the first level or the second level.

8. The current switching circuit according to claim 7, wherein the complementary circuit includes a CMOS inverter.

9. The current switching circuit according to claim 7 wherein the level shift element is selected from the group consisting of a resistor, a diode, and a transistor having a control electrode short circuited to another electrode of the transistor.

* * * * *